(12) United States Patent
Horiuchi

(10) Patent No.: US 10,937,684 B2
(45) Date of Patent: Mar. 2, 2021

(54) PLACEMENT MEMBER AND METHOD OF MANUFACTURING THE SAME

(71) Applicant: KYOCERA Corporation, Kyoto (JP)

(72) Inventor: Masahiko Horiuchi, Yasu (JP)

(73) Assignee: KYOCERA Corporation, Kyoto (JP)

( * ) Notice: Subject to any disclaimer, the term of this patent is extended or adjusted under 35 U.S.C. 154(b) by 420 days.

(21) Appl. No.: 14/648,221

(22) PCT Filed: Nov. 14, 2013

(86) PCT No.: PCT/JP2013/080791
§ 371 (c)(1),
(2) Date: May 28, 2015

(87) PCT Pub. No.: WO2014/084060
PCT Pub. Date: Jun. 5, 2014

(65) Prior Publication Data
US 2015/0311108 A1    Oct. 29, 2015

(30) Foreign Application Priority Data

Nov. 28, 2012  (JP) .............................. JP2012-259425

(51) Int. Cl.
*H01L 21/687* (2006.01)
*G03F 7/20* (2006.01)
*B05D 7/00* (2006.01)

(52) U.S. Cl.
CPC .......... *H01L 21/68757* (2013.01); *B05D 7/52* (2013.01); *G03F 7/707* (2013.01); *H01L 21/6875* (2013.01)

(58) Field of Classification Search
CPC .. G03F 7/707; G03F 7/70875; G03F 7/70708; G03F 7/0035; H01L 21/6831;
(Continued)

(56) References Cited

U.S. PATENT DOCUMENTS 4,551,192 A * 11/1985 Di Milia ................. G03F 7/707
                                                   118/731
6,413,701 B1 * 7/2002 van Empel ............. G03F 7/707
                                                   250/492.2
(Continued)

FOREIGN PATENT DOCUMENTS

EP    1 059 566 A2    12/2000
EP    1 291 910 A1    3/2003
(Continued)

OTHER PUBLICATIONS

International Search Report dated Feb. 18, 2014, issued in counterpart International application No. PCT/JP2013/080791.

*Primary Examiner* — Orlando E Aviles
*Assistant Examiner* — Seahee Hong
(74) *Attorney, Agent, or Firm* — Procopio Cory Hargreaves and Savitch LLP

(57) ABSTRACT

A placement member (1) in accordance with an embodiment of the present invention includes a base (4) having a placement section (3) on which an object (2) is placed, and a coating film (5) that coats at least a part of the placement section (3). The placement section (3) has a bottom face (8), a plurality of projections (9) projecting from the bottom face (8), and an annular protrusion (10) that protrudes from the bottom face (8) at the same height as the plurality of projections (9) and surrounds the plurality of projections (9). The coating film (5) has a first region (15) that coats top faces (11) of the projections (9) and a second region (16) that coats a top face (13) of the annular protrusion (10) and has a smaller thickness than that of the first region (15).

10 Claims, 7 Drawing Sheets

(58) Field of Classification Search
CPC . H01L 21/6833; H01L 21/6875; C23C 14/04;
C23C 14/042; C23C 14/0641
USPC .............. 269/900, 903, 289 R, 21, 309–310;
361/234; 355/72, 75
See application file for complete search history.

(56) References Cited

U.S. PATENT DOCUMENTS

| | | | |
|---|---|---|---|
| 7,092,231 B2* | 8/2006 | Hoeks | G03F 7/707 |
| | | | 355/72 |
| 7,791,857 B2* | 9/2010 | Mizuno | H01L 21/6833 |
| | | | 361/230 |
| 7,944,677 B2* | 5/2011 | Aruga | C23C 14/50 |
| | | | 361/234 |
| 9,449,865 B2* | 9/2016 | Hilbers | G03F 7/70708 |
| 2003/0001103 A1 | 1/2003 | Kobayashi et al. | |
| 2005/0128444 A1 | 6/2005 | Ottens et al. | |
| 2005/0152089 A1* | 7/2005 | Matsuda | H02N 13/00 |
| | | | 361/234 |
| 2005/0195382 A1* | 9/2005 | Ottens | G03F 7/707 |
| | | | 355/72 |
| 2007/0200243 A1* | 8/2007 | Kraus | C23C 16/34 |
| | | | 257/763 |
| 2008/0011737 A1* | 1/2008 | Fukuoka | H01L 21/67103 |
| | | | 219/444.1 |
| 2009/0060688 A1* | 3/2009 | Asada | B24B 37/30 |
| | | | 414/217 |
| 2010/0096262 A1 | 4/2010 | Aruga et al. | |
| 2013/0155569 A1* | 6/2013 | Suuronen | B23Q 3/152 |
| | | | 361/234 |
| 2013/0301028 A1* | 11/2013 | Albert | H01L 21/6875 |
| | | | 355/72 |

FOREIGN PATENT DOCUMENTS

| | | |
|---|---|---|
| EP | 1 530 088 A1 | 5/2005 |
| EP | 1 530 089 A1 | 5/2005 |
| EP | 2 267 535 A1 | 12/2010 |
| JP | 08-139168 A | 5/1996 |
| JP | H08-195428 A | 7/1996 |
| JP | H11-163103 A | 6/1999 |
| JP | 2001-28333 A | 1/2001 |
| JP | 2005-142566 A | 6/2005 |
| JP | 2009-272646 A | 11/2009 |
| JP | 2010-166085 A | 7/2010 |
| JP | 2012-119378 A | 6/2012 |

* cited by examiner

PLACEMENT MEMBER AND METHOD OF MANUFACTURING THE SAME

TECHNICAL FIELD

The present invention relates to a placement member on which an object such as a wafer and a glass substrate is placed when the object is subjected to treatment in each of steps of manufacturing a semiconductor integrated circuit and a liquid crystal display, and a method of manufacturing the placement member.

BACKGROUND ART

In a step of manufacturing a semiconductor integrated circuit or a liquid crystal display, an object such as a wafer used to manufacture the semiconductor integrated circuit or a glass substrate used to manufacture the liquid crystal display is placed on a placement member such as an exposure apparatus or an inspection apparatus, and is subjected to treatment.

For example, JP 8-195428 A describes, as the placement member, a vacuum suction device provided with an annular seal section that surrounds a vacuum suction section to form a minute gap between the seal section and a sample.

When the surface roughness of the top face of the seal section is large, irregularities on the top face of the seal section become large, generating sites largely separated from the sample on the top face of the seal section. For this reason, for example, in vacuum-sucking the sample, a leakage tends to occur in the seal section. As a result of the leakage, outside air is sucked into the vacuum suction section, decreasing the negative pressure of the vacuum suction section. This lowers the suction force for the sample.

Therefore, it is required to provide a placement member having a seal section of reduced leakage.

SUMMARY OF THE INVENTION

The present invention meets the request to provide a placement member having a seal section of reduced leakage.

A placement member according to one aspect of the present invention includes a base having a placement section on which an object is placed, and a coating film that coats at least a part of the placement section. The placement section has a bottom face, a plurality of projections protruding from the bottom face, and an annular protrusion that protrudes from the bottom face at the same height as the plurality of projections and surrounds the plurality of projections. The coating film has a first region that coats top faces of the projections, and a second region that coats a top face of the annular protrusion and has a smaller thickness than that of the first region.

A placement member according to another aspect of the present invention includes a base having a placement section on which an object is placed, and a coating film that coats at least a part of the placement section. The placement section has a bottom face, a plurality of projections protruding from the bottom face, and an annular protrusion that protrudes from the bottom face at the same height as the plurality of projections and surrounds the plurality of projections. The coating film has a first region that coats top faces of the projections and allows a top face of the annular protrusion to be exposed.

A method of manufacturing a placement member according to one aspect of the present invention includes: preparing a base including a placement section on which an object is placed, the placement section having a bottom face, a plurality of projections protruding from the bottom face, and an annular protrusion that surrounds the plurality of projections and protrudes from the bottom face at the same height as the plurality of projections; and forming a coating film having a first region that coats top faces of the projections, and a second region that coats a top face of the annular protrusion and has a smaller thickness than that of the first region on the placement section.

According to one aspect of the present invention, the surface roughness of the top face of the seal section can be reduced to provide a placement member having a seal section with reduced leakage.

According to the method of manufacturing a placement member from one aspect of the present invention, the seal section having a low surface roughness of the top face can be formed to provide a placement member having a seal section with reduced leakage.

EMBODIMENT FOR CARRYING OUT THE INVENTION

A placement member in accordance with an embodiment of the present invention will be described below in detail with reference to FIG. 1 to FIG. 4.

Figure 1:
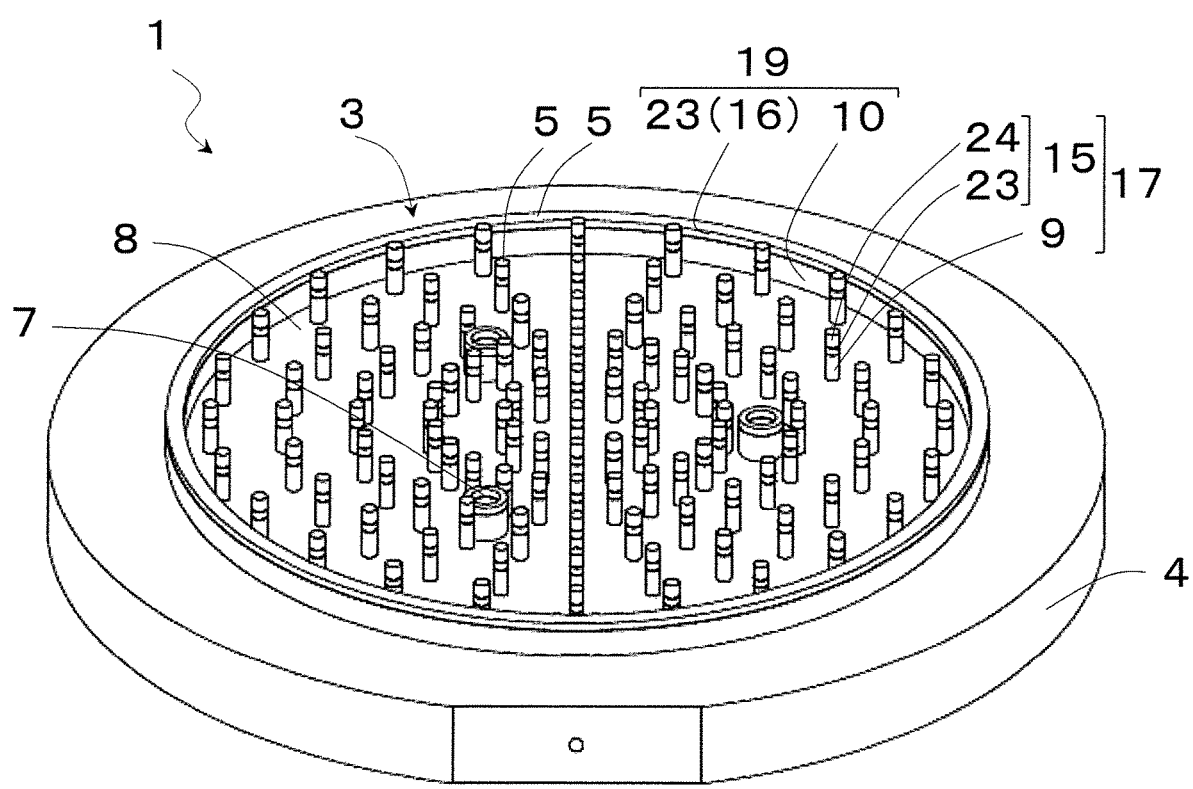
FIG. 1 is a perspective view illustrating a placement member in accordance with an embodiment of the present invention.
Figure 2:
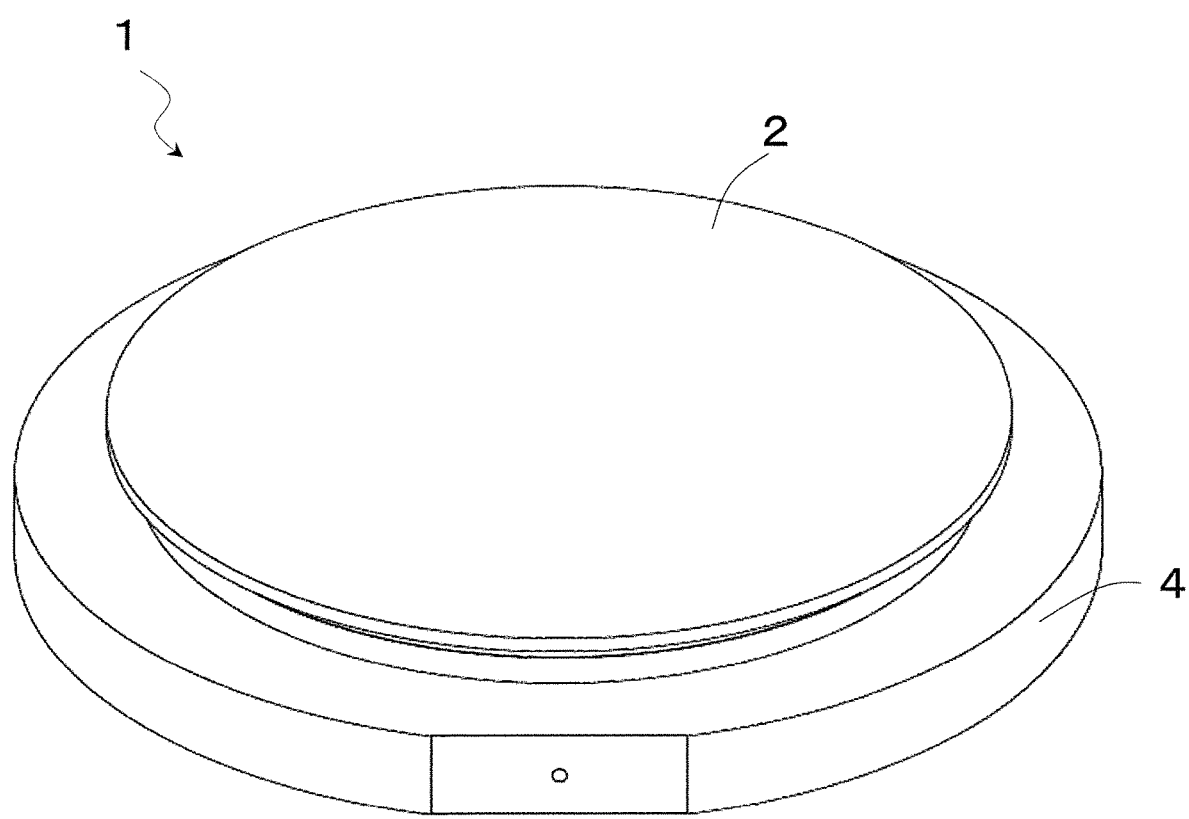
FIG. 2 is a perspective view illustrating the state where an object is placed on the placement member in FIG. 1.

A placement member 1 illustrated in FIG. 1 and FIG. 2 is a member on which an object 2 such as a wafer or a glass substrate is placed in an apparatus such as an exposure apparatus and an inspection apparatus for use in a step of manufacturing a semiconductor integrated circuit or a liquid crystal display. The object 2 placed on the placement member 1 is subjected to various types of treatment in various apparatuses. For example, the exposure apparatus includes the placement member 1 and a light source. In the exposure apparatus, the light source irradiates the object 2 sucked onto the placement member 1 with light to expose the object 2, generating a wiring pattern.

Figure 3:
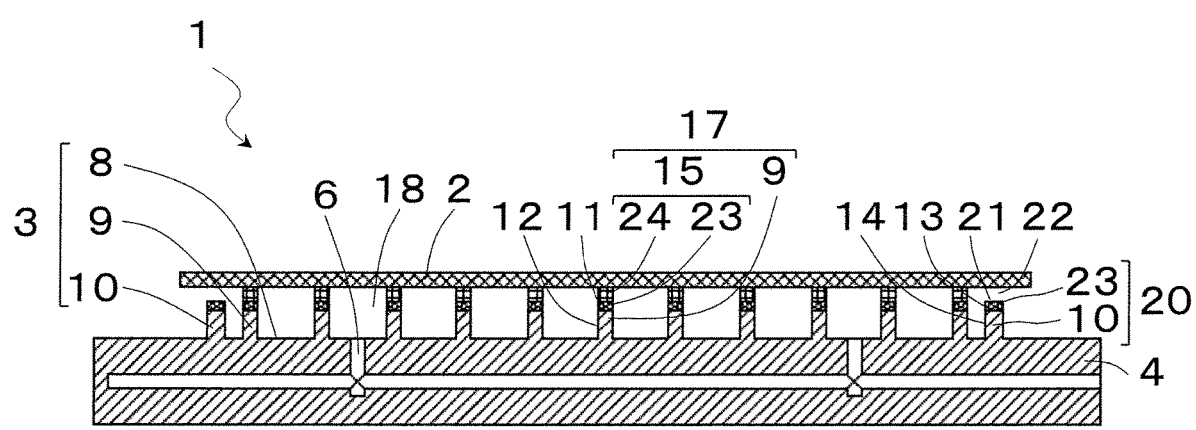
FIG. 3 is a sectional view illustrating the placement member in FIG. 1 taken along a cross section including an exhaust hole in the thickness direction.
Figure 4:
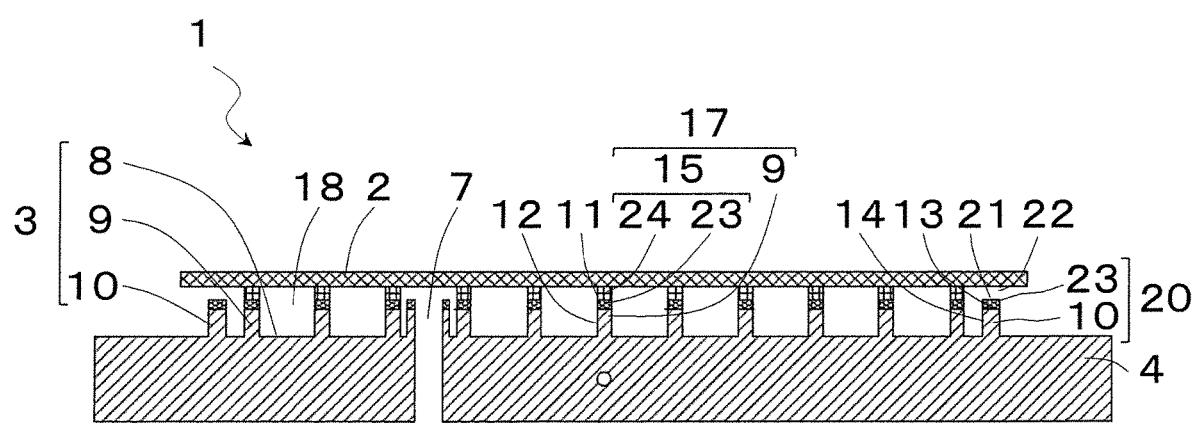
FIG. 4 is a sectional view illustrating the placement member in FIG. 1 taken along a cross section including an insertion hole in the thickness direction.

The placement member 1 in this embodiment is a vacuum chuck that vacuum-sucks the object 2. As illustrated in FIG. 3 and FIG. 4, the placement member 1 includes a base 4 having a placement section 3 on which the object 2 is placed, a coating film 5 that coats at least a part of the placement section 3, an exhaust hole 6 that penetrates the base 4 in the thickness direction and is connected to an exhaust means (not shown), and an insertion hole 7 that penetrates the base 4 in the thickness direction and into which a lift pin (not shown) is inserted.

The base 4 of the placement member 1 is made of ceramics, resin, or metal. Due to low coefficient of thermal expansion, high abrasion resistance, and high stiffness, most preferably, the base 4 is made of ceramics. Various ceramic sintered bodies including an alumina sintered body, a silicon nitride sintered body, a cordierite sintered body, or a silicon carbide sintered body (SiC-based or Si—SiC-based) can be used as the ceramics. In terms of prevention of contamination of the wafer, most preferably, the silicon carbide sintered body is used as the ceramics. The base 4 in this embodiment is disc-like. For example, a thickness of the base 4 is within the range of 1 to 50 mm. For example, a width (diameter) of the base 4 is within the range of 25 to 3500 mm.

As illustrated in FIG. 3 and FIG. 4, the placement section 3 of the base 4 has a bottom face 8, a plurality of projections 9 protruding from the bottom face 8, and an annular protrusion 10 that surrounds the plurality of projections 9. That is, the bottom face 8 is disposed between the projections 9 and the annular protrusion 10, the projections 9 are disposed inner from the annular protrusion 10, and the annular protrusion 10 is disposed on the outer edge of the placement section 3.

The projections 9 each have a top face 11 and a side face 12, and are columnar, for example. For example, a height of each projection 9 is within the range of 3 to 1000 μm, and a width (diameter) of the projection 9 is within the range of 0.01 to 5 mm. The projections 9 each may be shaped like a polygonal pole such as a triangular pole or a square pole.

The annular protrusion 10 has a top face 13 and a side face 14, and is annular, for example. The annular protrusion 10 protrudes from the bottom face 8 at the same height as the plurality of projections 9. For example, a width (distance from its outer circumference and its inner circumference) of the annular protrusion 10 is within the range of 0.01 to 5 mm. The width of the annular protrusion 10 may be the same as or different from the width of the projections 9. In this embodiment, the width of the annular protrusion 10 is larger than the width of the projection 9. A part of the annular protrusion 10 may bellow or protrude toward the inner side of the placement section 3 in a plan view. An error between the height of the plurality of projections 9 and the height of the annular protrusion 10 is within ±20%.

The coating film 5 is formed of a ceramic film, a metal film, or a resin film. The ceramic film is made of a ceramic material such as silicon oxide, silicon nitride, titanium nitride, titanium carbide, alumina or DLC (Diamond-Like Carbon). The metal film is made of a metal such as aluminum, chromium, or gold. The resin film is made of a resin such as polyimide resin or para-xylene resin. When the coating film 5 is used in the step of manufacturing the semiconductor integrated circuit in the exposure apparatus, to prevent contamination of the wafer, an Si-based material such as silicon oxide and silicon nitride, a Ti-base material such as titanium nitride and titanium carbide, or C-based material such as DLC is desirably adopted. Most desirably, the coating film 5 is made of titanium nitride. Using titanium nitride can improve abrasion resistance to suppress the occurrence of particles. In addition, conductivity can be imparted to the coating film 5.

The coating film 5 has a first region 15 that coats the top faces 11 of the projections 9 and a second region 16 that coats the top face 13 of the annular protrusion 10. The coating film 5 allows the side faces 12 of the projections 9 and the side face 14 of the annular protrusion 10 to be exposed. The projections 9 and the first region 15 constitute a support section 17 that supports the object 2, and the annular protrusion 10 and the second region 16 constitute a seal section 19 that seals a space 18 between the object 2 and the placement section 3.

The placement and suction of the object 2 on the placement member 1 are performed as follows, for example. First, a top face of the lift pin inserted into the insertion hole 7 is moved above the placement section 3 and then, the object 2 is placed on the lift pin. Next, the top faces of the lift pin is moved below the placement section 3, and the object 2 is supported by a top face 20 of the support section 17. The object 2 is placed on the placement section 3 in this manner. At this time, the space 18 between the object 2 and the placement section 3 is sealed with the seal section 19. This prevents movement of fluid such as air between the space 18 and the outside. Next, air in the space 18 sealed with the seal section 19 is exhausted through the exhaust hole 6 by using the exhaust means. Then, the space 18 is put into the vacuum state, thereby vacuum-sucking the object 2 onto the placement section 3.

A height of the seal section 19 is smaller than a height of the support section 17. A difference between the support section 17 and the seal section 19 in height is minute. A minute gap 22 is generated between the object 2 placed on the placement section 3 and a top face 21 of the seal section 19 depending on the difference in height. The minute gap 22 lets only an extremely small amount of fluid such as air through and thus, functions as a static seal to seal the space 18 between the object 2 and the placement section 3. Further, the minute gap 22 suppresses contact of the object 2 with the top face 21 of the seal section 19. This can prevent the flatness of the object 2 from lowering due to the contact, improving the treatment accuracy of the object 2.

For example, the difference between the support section 17 and the seal section 19 in height, that is, the distance of the minute gap 22 in the vertical direction (Z direction) is within the range of 0.5 to 20 μm. The difference in height is desirably within the range of 1 to 3 μm. The difference in height of 1 μm or more can further suppress the contact of the object 2 with the seal section 19. The difference in height of 3 μm or less can further seal the space 18 between the object 2 and the placement section 3.

When the difference between the support section 17 and the seal section 19 in height generates a difference between the projections 9 and the annular protrusion 10 in height, it is necessary to make the height of the annular protrusion 10 smaller than the height of the projections 9 by processing the top face 13 of the annular protrusion 10 by blasting or the like. Thus, the surface roughness of the top face 13 of the annular protrusion 10, in turn, the surface roughness of the top face 21 of the seal section 19 tends to increase.

In the placement member 1 in this embodiment, a height of the plurality of projections 9 is equal to a height of the annular protrusion 10, and a thickness of the second region 16, which coats the top face 13 of the annular protrusion 10, is smaller than a thickness of the first region 15 of the coating film 5, which coats the top faces 11 of the protrusions 9. That is, the difference between the first region 15 and the second region 16 in thickness rather than the difference between the projections 9 and the annular protrusion 10 in height generates the difference between the support section 17 and the seal section 19 in height.

Thus, it is not necessary to process the top face 13 of the annular protrusion 10 to make the height of the annular protrusion 10 smaller than the height of the projections 9. Accordingly, the surface roughness of the top face 13 of the annular protrusion 10 can be reduced to suppress leakage of fluid such as air from the seal section 19. This can realize the placement member 1 as a vacuum chuck having a good absorbability.

The top face 21 of the seal section 19 is coated with the first region 15 of the coating film 5. Thus, since the first region 15 of the coating film 5 weakens the effect of irregularities on the top face 13 of the annular protrusion 10, as compared to the case where the top face 21 of the seal section 19 is formed of the top face 13 of the annular protrusion 10, the surface roughness of the top face 21 of the seal section 19 can be decreased. The surface roughness may be an arithmetic average roughness (Ra). For example, an arithmetic average roughness (Ra) of the top face 21 of the seal section 19 is within the range of 0.003 to 0.02 μm. The arithmetic average roughness (Ra) is defined according to JISB0601:2001.

In the placement member 1 in this embodiment, the coating film 5 includes a first film 23 that coats at least a part of the placement section 3 and a second film 24 that coats a part of the first film 23. The first region 15 includes the first film 23 that coats the top faces 11 of the protrusions 9 and the second film 24 that coats the first film 23. The second region 16 consists of the first film 23 that coats the top face 13 of the annular protrusion 10.

Due to the presence/absence of the second film 24, a thickness of the second region 16 can be made smaller than a thickness of the first region 15. Thus, the thickness of the second film 24 can be adjusted to adjust the difference between the support section 17 and the seal section 19 in height with high accuracy, and the distance of the minute gap 22 in the vertical direction with high accuracy.

A thickness of the first film 23 is desirably smaller than a thickness of the second film 24. By decreasing the thickness of the first region 15 that coats the top face 21 of the seal section 19, partial variation of the first region 15 in thickness can be reduced to make the first region 15 smoother. This can adjust the distance of the minute gap 22 with high accuracy. For example, the thickness of the first film 23 is within the range of 0.01 to 50 μm. The thickness of the second film 24 is equal to the distance of the minute gap 22 in the vertical direction.

Materials for the first film 23 and the second film 24 are appropriately selected from among materials for the coating film 5. The first film 23 and the second film 24 may be made of the same material. In this case, the top face 21 of the seal section 19, which is coated with the first film 23, and the top face 20 of the support section 17, which is coated with the second film 24, may have the same property. For example, both of the first film 23 and the second film 24 may be made of titanium nitride.

The first film 23 and the second film 24 may be made of different materials. In this case, the top face 21 of the seal section 19, which is coated with the first film 23, and the top face 20 of the support section 17, which is coated with the second film 24, may have different properties. For example, the first film 23 may be made of silicon oxide, and the second film 24 may be made of titanium nitride. As a result, the top face 21 of the seal section 19 may have water repellency and insulation property, and the top face 20 of the support section 17 may have conductivity.

The first film 23 and the second film 24 each may be formed of one layer or a plurality of layers. In the multilayer case, the layers may be made of different materials.

In the placement member 1 in this embodiment, the top face 13 of the annular protrusion 10 is a ground face which has been subjected to the grinding processing. Thus, the surface roughness of the top face 13 of the annular protrusion 10, in turn, the surface roughness of the top face 21 of the seal section 19 can be reduced. For example, an arithmetic average roughness (Ra) of the top face 13 of the annular protrusion 10 is within the range of 0.003 to 0.02 μm.

The top faces 11 of the protrusions 9 are ground faces which have been subjected to the grinding processing. Thus, the surface roughness of the top faces 11 of the protrusions 9, in turn, the surface roughness of the top face 20 of the support section 17 can be reduced. An arithmetic average roughness (Ra) of the top faces 11 of the protrusions 9 is the same as an arithmetic average roughness (Ra) of the top face 13 of the annular protrusion 10. An error between the arithmetic average roughness (Ra) of the top face 13 of the annular protrusion 10 and the arithmetic average roughness (Ra) of the top faces 11 of the protrusions 9 is within 30%.

The bottom face 8 disposed between the plurality of projections 9 and the annular protrusion 10 is a ground face, a blasted face, or a laser machined face. A surface roughness of the bottom face 8 is larger than the surface roughness of the top faces 11 of the protrusions 9 and the surface roughness of the top face 13 of the annular protrusion 10 as ground faces. For example, an arithmetic average roughness (Ra) of the bottom face 8 is within the range of 0.3 to 6.3 μm.

Using the case where the base 4 is made of ceramics, a method of manufacturing the placement member 1 will be described below in detail with reference to FIG. 5(a), FIG. 5(b), FIG. (c), FIG. 5(d), FIG. 6(a), FIG. 6(b) and FIG. 6(c).

Figure 5A:
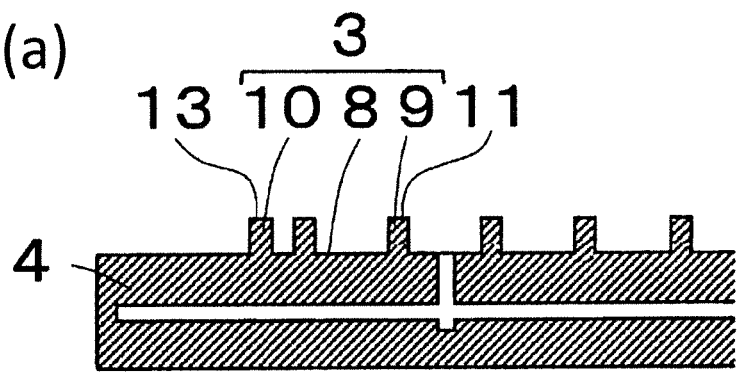
FIG. 5(a), FIG. 5(b), FIG. 5(c) and FIG. 5(d) are a sectional view for describing a method of manufacturing the placement member in FIG. 1 taken in the thickness direction.

(1) As illustrated in FIG. 5(a), the base 4 is prepared. Specifically, the preparation is made as follows.

First, pure water and an organic binder are added to ceramic powders and then, they are wet-blended in a ball mill to produce a slurry. Next, the slurry is granulated by spry drying. Next, the granulated ceramic powders are molded into a body by various molding methods, and the molded body is cut into a predetermined shape. Next, the molded body is sintered, for example, under the temperature of 1000 to 2300 C to produce a sintered body, and the sintered body is cut into a predetermined shape to form the placement section 3 having the bottom face 8, the projections 9, and the annular protrusion 10. The placement section 3 may be formed by blasting or laser machining after cutting. In the placement section 3, the projections 9 and the annular protrusion 10 have the same height. Next, the top faces 11 of the protrusions 9 and the top face 13 of the annular protrusion 10 of the sintered body are simultaneously ground to make the top faces 11 of the protrusions 9 and the top face 13 of the annular protrusion 10 into ground faces. Examples of the grinding include lapping and polishing. For example, lapping can be performed by using an abrasive made of any suitable material such as diamond or alumina, and a lapping machine made of any suitable material such as cast iron or tin.

The base 4 can be manufactured as described above.

After the height of the projections 9 is made larger than the height of the annular protrusion 10, it is difficult to grind the top face 13 of the annular protrusion 10. Especially when a part of the annular protrusion 10 bellows or protrudes toward the inner side of the placement section 3 in a plan view, it is more difficult to grind the top face 13.

On the contrary, in this embodiment, because the height of the projections 9 is made equal to the height of the annular protrusion 10 and then, the top faces 11 of the protrusions 9 and the top face 13 of the annular protrusion 10 are simultaneously ground, the top face 13 of the annular protrusion 10 can be readily ground.

(2) As illustrated in FIG. 5(b), FIG. 5(c), FIG. 5(d), FIG. 6(a), FIG. 6(b) and FIG. 6(c), the coating film 5 is formed on the base 4 to produce the placement member 1. Specifically, the placement member 1 is produced as follows.

Figure 5B:
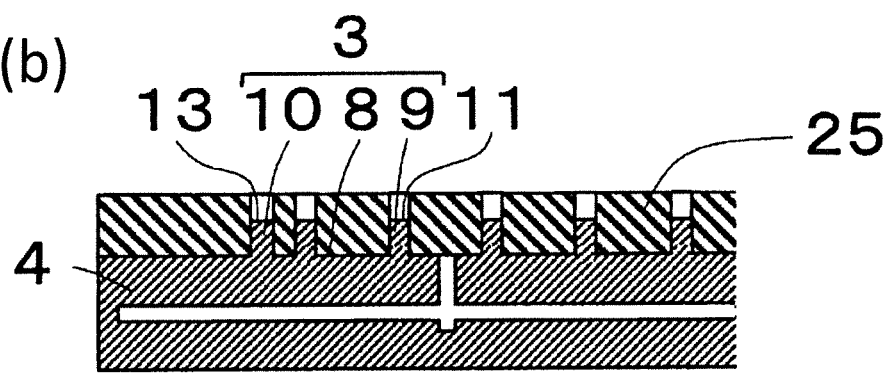
Figure 5C:
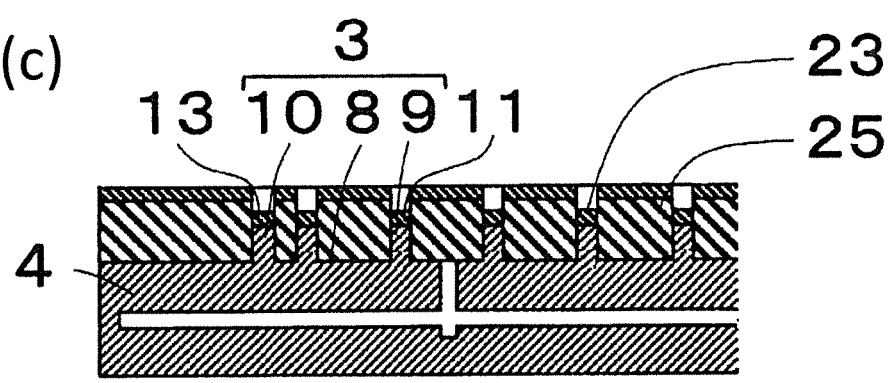
Figure 5D:
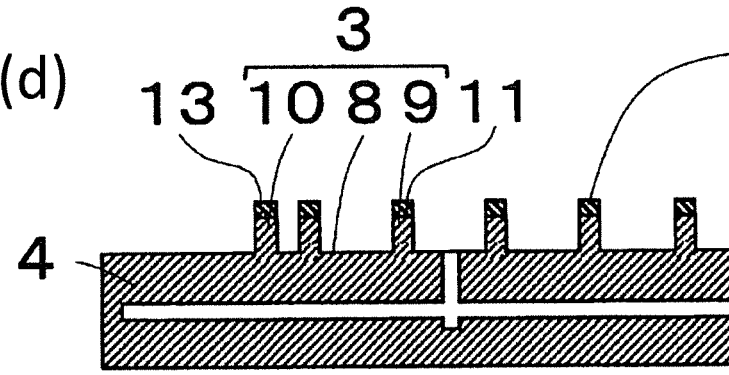
Figure 6A:
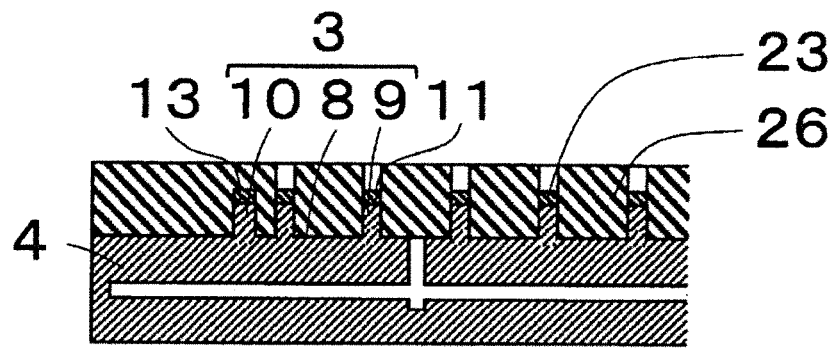
FIG. 6(a), FIG. 6(b), and FIG. 6(c) are a sectional view for describing the method of manufacturing the placement member in FIG. 1 taken in the thickness direction.
Figure 6B:
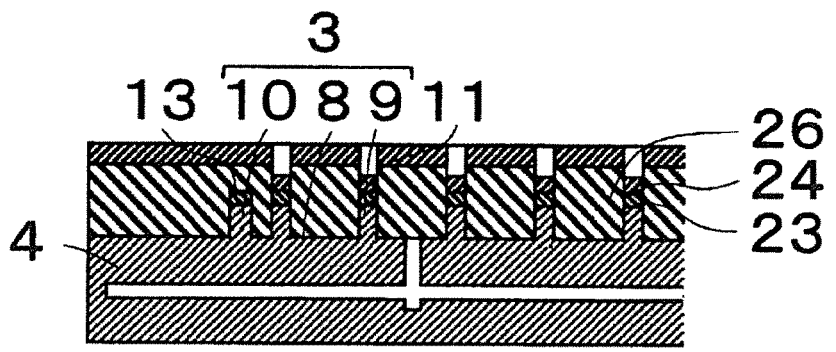
Figure 6C:
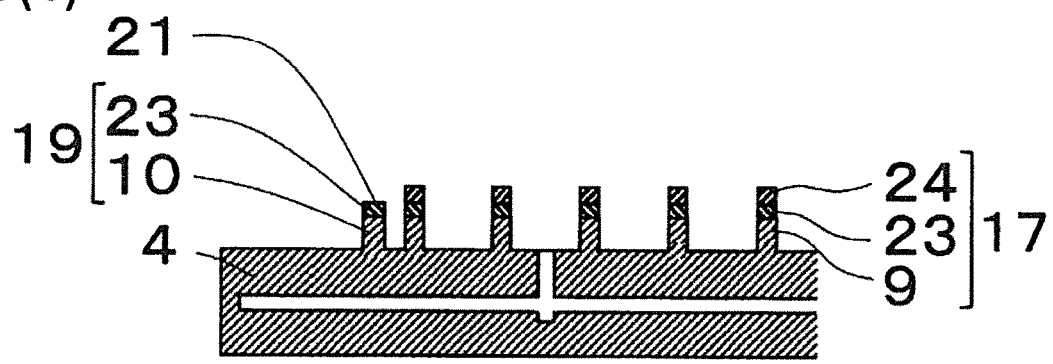

First, as illustrated in FIG. 5(b), a first resist 25 made of photosetting resin or the like is formed in the placement section 3 of the base 4 by photolithography. The first resist 25 coats the bottom face 8, and allows the top faces 11 of the protrusions 9 and the top face 13 of the annular protrusion 10 to be exposed. Next, as illustrated in FIG. 5(c), the first film 23 that coats the top faces 11 of the protrusions 9 and the top face 13 of the annular protrusion 10 is formed by any suitable film formation method such as PVD, CVD, deposition, ion plating, or sputtering. Next, as illustrated in FIG. 5(d), the first resist 25 is removed from the placement section 3 on the base 4. Next, as illustrated in FIG. 6(a), a second resist 26 made of photosetting resin or the like is formed in the placement section 3 of the base 4 by photolithography. The second resist 26 coats the first film 23 on the bottom face 8 and the top face 13 of the annular protrusion 10, and allows the first film 23 on the top faces 11 of the protrusions 9 to be exposed. Next, as illustrated in FIG. 6(b), the second film 24 that coats only the first film 23 on the top faces 11 of the protrusions 9, out of the top faces 11 of the protrusions 9 and the top face 13 of the annular protrusion 10, is formed by any suitable film formation method such as PVD, CVD, deposition, ion plating, or sputtering. Next, as illustrated in FIG. 6(c), the second resist 26 is removed from the placement section 3 on the base 4.

In this manner, the coating film 5 can be formed on the base 4 to manufacture the placement member 1 in this embodiment as illustrated in FIG. 1 to FIG. 4.

As a result, the surface roughness of the top face 21 of the seal section 19, height of which is smaller than the height of the support section 17, can be lowered to form the seal section 19 with reduced leakage. The height of the support section 17 and the seal section 19 as well as the distance of the minute gap 22 in the vertical direction can be adjusted with high accuracy.

The present invention is not limited to the above embodiment, and various changes, modifications, and combinations may be made so as not to deviate from the subject matter of the present invention.

Although the vacuum chuck is used as the placement member 1 in the above description, the placement member 1 may be any member on which the object 2 is placed, for example, a chuck (suction member) other than a vacuum chuck. In this case, the placement member 1 may be an electrostatic chuck that electrostatically sucks the object 2, or a suction member that fills water between the object 2 and the placement section 3 to suck the object 2. In these cases, the space 18 between the object 2 and the placement section 3 may be filled with fluid including gas other than air, such as hydrogen, and liquid such as water. Leakage of the fluid can be properly suppressed by the seal section 19.

Figure 7:
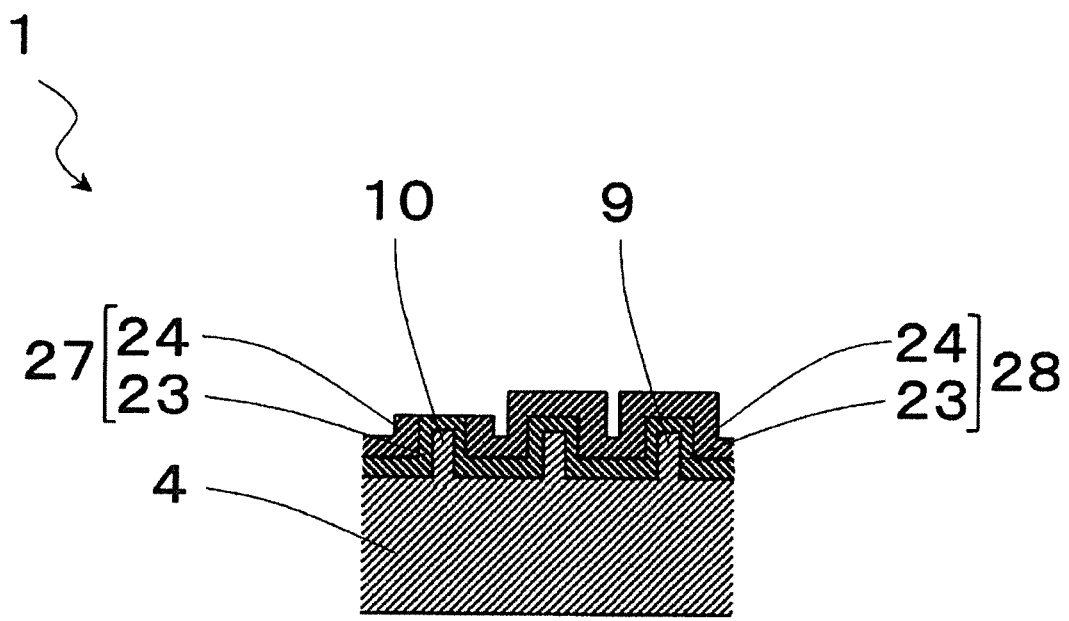
FIG. 7 is a sectional view illustrating a placement member in accordance with another embodiment of the present invention taken in the thickness direction.

Although the coating film 5 allows the side faces 12 of the projections 9 and the side face 14 of the annular protrusion 10 to be exposed in the above description, as illustrated in FIG. 7, the coating film 5 may include a third region 27 that coats the side face 14 of the annular protrusion 10, and a fourth region 28 that coats the side faces 12 of the projections 9. In this case, by appropriately selecting the material for the coating film 5, desired characteristics including insulation property and conductivity can be imparted to the side faces of the seal section 19 and the support section 17. For example, the third region 27 and the fourth region 28 are composed of the first film 23 and the second film 24. The coating film 5 can be formed by exposing the side faces 12 of the projections 9 and the side face 14 of the annular protrusion 10 from the first resist 25 and the second resist 26 in the step (2) in the embodiment.

Figure 8:
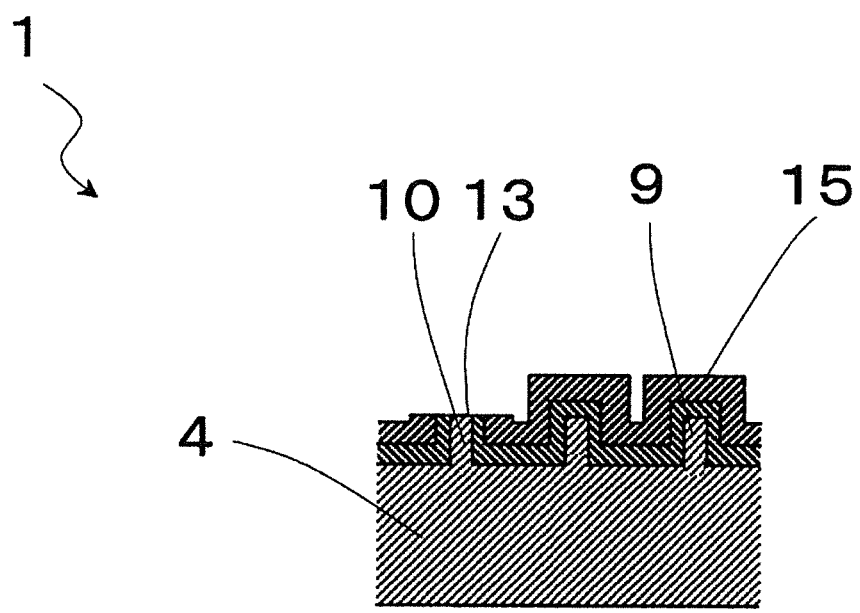
FIG. 8 is a sectional view illustrating a placement member in accordance with another embodiment of the present invention taken in the thickness direction.

Although the coating film 5 has the first region 15 that coats the top faces 11 of the protrusions 9 and the second region 16 that coats the top face 13 of the annular protrusion 10, as illustrated in FIG. 8, the coating film 5 may have the first region 15 and allow the top face 13 of the annular protrusion 10 to be exposed. In this case, since the projections 9 and the annular protrusion 10 have the same height, due to the presence/absence of the coating film 5, the difference between the support section 17 and the seal section 19 in height is generated to form the minute gap 22. Moreover, since the projections 9 and the annular protrusion 10 have the same height, the top face 13 of the annular protrusion 10 can be formed without performing treatment for increasing the surface roughness, such as blasting, and thus, the surface roughness of the top face 21 of the seal section 19 can be reduced. The top face 13 of the annular protrusion 10 is desirably a ground face. The coating film 5 can be formed by coating the top faces 11 of the protrusions 9 with the first resist 25 in the step (2) in the embodiment. Although the coating film 5 in FIG. 8 is formed of the first film 23 and the second film 24, the coating film 5 may be formed of only the first film 23. In this case, since the coating film 5 is formed of one film, the coating film 5 can be readily formed, and peeling in the coating film 5 can be reduced.

Although the first resist 25 and the second resist 26 are formed by photolithography to form the coating film 5 in the above description, a mask may be used in place of the first resist 25 and the second resist 26. A patterned metal plate (ex. stainless plate) or resin plate may be used as the mask.

REFERENCE SIGNS LIST

1: placement member
2: object
3: placement section
4: base
5: coating film
6: exhaust hole
7: insertion hole
8: bottom face
9: projection
10: annular protrusion
11 top face of projection
12: side face of projection
13: top face of annular protrusion
14: side face of annular protrusion
15: first region of coating film
16: second region of coating film
17: support section
18: space between object and placement section
19: seal section
20: top face of support section
21 top face of the seal section
22: minute gap
23: first film
24: second film
25: first resist 26: second resist
27: third region
28: fourth region

The invention claimed is:

1. A placement member for a vacuum chuck, the placement member comprising:
    a base including a placement section on which an object is placed and an exhaust hole, wherein the placement section comprises a bottom face, a plurality of projections protruding from the bottom face, and an annular protrusion that protrudes from the bottom face and surrounds the plurality of projections, wherein the plurality of projections and the annular protrusion have a same height, and wherein the exhaust hole penetrates the base and is configured to be connected to an exhaust system so as to create a vacuum suction force that seals the object to the placement section;
    a first film that coats each of the plurality of projections and the annular protrusion and has an equal thickness across each of the plurality of projections and the annular protrusion, such that the plurality of projections with the first film and the annular protrusion with the first film have a same height; and
    a second film that coats the first film on each of the plurality of projections but not on the annular protrusion, such that the plurality of projections with the first film and the second film have a greater height than the annular protrusion with only the first film,
    wherein a thickness of the first film is smaller than a thickness of the second film,
    wherein the first film is made of silicon oxide, and
    wherein the second film is made of titanium nitride.

2. The placement member according to claim 1, wherein the thickness of the second film is within the range of 1 to 3 μm.

3. The placement member according to claim 1, wherein the plurality of projections with the first film and the second film constitute a support section that supports the object, and wherein the annular protrusion with the first film but not the second film constitutes a seal section that seals a space between the object and the placement section.

4. The placement member according to claim 1, wherein side faces of the plurality of projections and the annular protrusion are exposed without being coated.

5. A method of manufacturing a placement member for a vacuum chuck, the method comprising:
    preparing a base including a placement section on which an object is placed and an exhaust hole, the placement section comprising a bottom face, a plurality of projections protruding from the bottom face, and an annular protrusion that surrounds the plurality of projections and protrudes from the bottom face, wherein the plurality of projections and the annular protrusion have a same height, and wherein the exhaust hole penetrates the base and is configured to be connected to an exhaust system so as to create a vacuum suction force that seals the object to the placement section; and
    forming a first film that coats a top face of each of the plurality of projections and the annular protrusion and has an equal thickness across each of the plurality of projections and the annular protrusion, such that the plurality of projections with the first film and the annular protrusion with the first film have a same height; and
    forming a second film that coats the first film on each of the plurality of projections but not on the annular protrusion, such that the plurality of projections with the first film and the second film have a greater height than the annular protrusion with only the first film,
    wherein a thickness of the first film is smaller than a thickness of the second film,
    wherein the first film is made of silicon oxide, and
    wherein the second film is made of titanium nitride.

6. The method of manufacturing the placement member according to claim 5, wherein the preparing the base includes simultaneously grinding the top faces of the plurality of projections and the top face of the annular protrusion, thereby making the height of the plurality of projections equal to the height of the annular protrusion.

7. A placement member comprising:
    a base including a placement section on which an object is placed, wherein the placement section comprises a bottom face, a plurality of projections protruding from the bottom face, and an annular protrusion that protrudes from the bottom face and surrounds the plurality of projections, wherein the plurality of projections and the annular protrusion have a same height;
    a first film that coats each of the plurality of projections and the annular protrusion and has an equal thickness across each of the plurality of projections and the annular protrusion, such that the plurality of projections with the first film and the annular protrusion with the first film have a same height; and
    a second film that coats the first film on each of the plurality of projections but not on the annular protrusion, such that the plurality of projections with the first film and the second film have a greater height than the annular protrusion with only the first film,
    wherein a thickness of the first film is smaller than a thickness of the second film,
    wherein the first film is made of silicon oxide, and
    wherein the second film is made of titanium nitride.

8. The placement member according to claim 7, wherein the thickness of the second film is within the range of 1 to 3 μm.

9. The placement member according to claim 7, wherein the plurality of projections with the first film and the second film constitute a support section that supports the object, and wherein the annular protrusion with the first film but not the second film constitutes a seal section that seals a space between the object and the placement section.

10. The placement member according to claim 7, wherein side faces of the plurality of projections and the annular protrusion are exposed without being coated.

* * * * *